United States Patent
Surinphong

(10) Patent No.: US 10,128,091 B2
(45) Date of Patent: Nov. 13, 2018

(54) FILTER APPARATUS FOR ARC ION EVAPORATOR USED IN CATHODIC ARC PLASMA DEPOSITION SYSTEM

(71) Applicant: Surasak Surinphong, Samutprakarn (TH)

(72) Inventor: Surasak Surinphong, Samutprakarn (TH)

(*) Notice: Subject to any disclaimer, the term of this patent is extended or adjusted under 35 U.S.C. 154(b) by 0 days.

(21) Appl. No.: 15/501,598

(22) PCT Filed: Dec. 8, 2014

(86) PCT No.: PCT/TH2014/000053
§ 371 (c)(1),
(2) Date: Feb. 3, 2017

(87) PCT Pub. No.: WO2016/022078
PCT Pub. Date: Feb. 11, 2016

(65) Prior Publication Data
US 2017/0229294 A1    Aug. 10, 2017

(30) Foreign Application Priority Data
Aug. 4, 2014    (TH) .............................. 1401004479

(51) Int. Cl.
*H01J 37/34*    (2006.01)
*H01J 37/32*    (2006.01)
(Continued)

(52) U.S. Cl.
CPC ............ *H01J 37/34* (2013.01); *C23C 14/325* (2013.01); *C23C 14/564* (2013.01);
(Continued)

(58) Field of Classification Search
USPC ............ 250/281, 283, 288, 423 R, 424, 426; 313/359.1, 111, 111.81, 238, 569, 325,
(Continued)

(56) References Cited

U.S. PATENT DOCUMENTS 3,625,848 A    12/1971    Snaper
3,793,179 A *   2/1974   Sablev .................. C23C 14/325
                                                    118/718
(Continued)

FOREIGN PATENT DOCUMENTS

RU    2097868 C1    11/1997

OTHER PUBLICATIONS

"Institute of Mechatronics, Nanotechnology and Vacuum Technique", Jul. 9, 2010 (Jul. 9, 2010), XP055169721, Retrieved from the Internet [retrieved on 20150213].
(Continued)

*Primary Examiner* — Bernard Souw
(74) *Attorney, Agent, or Firm* — Innovation Capital Law Group, LLP; Vic Lin

(57) ABSTRACT

A filter apparatus for arc ion evaporator used in the cathodic arc plasma deposition system according to this invention is characterized by a set of multiple straight tubes placing in parallel to one another wherein the size and/or amount of large particles, which could contaminate the plasma beam, can be controlled. The filter apparatus further comprises a set of solenoid coils which coil around the filter to generate a magnetic field to drive plasma to the targeting object or material.

The filter apparatus of this present invention can reduce a number of large particles in the plasma beam and can further be designed into compacted shapes with high flexibility for adaptation in order to suit engineering demands. In addition, the filter apparatus according to this invention does not hinder the line of sight and is in consistent with the direction of plasma movement so that large number of plasma can be obtained, resulting in a reduced electrical consumption for
(Continued)

driving the plasma and a faster deposition rate to enable quick, high volume production of quality products at a reasonable cost.

20 Claims, 12 Drawing Sheets

(51) Int. Cl.
C23C 14/32 (2006.01)
C23C 14/56 (2006.01)
(52) U.S. Cl.
CPC .. *H01J 37/32055* (2013.01); *H01J 37/32422* (2013.01); *H01J 37/32871* (2013.01)
(58) Field of Classification Search
USPC ............... 313/335–337; 204/192.11, 192.38, 204/298.04, 298.41
See application file for complete search history.

(56) References Cited

U.S. PATENT DOCUMENTS

| 4,988,484 | A | * | 1/1991 | Karlson | A61L 2/202 |
| | | | | | 422/186.07 |
| 5,380,421 | A | * | 1/1995 | Gorokhovsky | C23C 14/325 |
| | | | | | 204/192.38 |
| 5,433,836 | A | | 7/1995 | Martin et al. | |
| 5,435,900 | A | * | 7/1995 | Gorokhovsky | C23C 14/221 |
| | | | | | 118/723 R |
| 5,495,143 | A | * | 2/1996 | Lengyel | H01J 1/304 |
| | | | | | 313/309 |
| 6,465,780 | B1 | | 10/2002 | Anders et al. | |
| 6,511,585 | B1 | * | 1/2003 | Shi | H01J 27/14 |
| | | | | | 118/723 VE |
| 6,548,817 | B1 | * | 4/2003 | Anders | H01J 37/32055 |
| | | | | | 250/426 |
| 8,382,963 | B2 | * | 2/2013 | Weber | C23C 14/0641 |
| | | | | | 204/192.12 |
| 8,963,079 | B2 | * | 2/2015 | Ouyang | H01J 49/0404 |
| | | | | | 250/281 |
| 8,969,795 | B2 | * | 3/2015 | Wollnik | H01J 49/10 |
| | | | | | 250/282 |
| 9,159,540 | B2 | * | 10/2015 | Ouyang | H01J 49/0404 |
| 9,484,195 | B2 | * | 11/2016 | Ouyang | H01J 49/0404 |
| 9,761,424 | B1 | * | 9/2017 | Gorokhovsky | H01J 37/3458 |
| 2002/0007796 | A1 | * | 1/2002 | Gorokhovsky | C23C 14/022 |
| | | | | | 118/723 ER |
| 2011/0174966 | A1 | * | 7/2011 | Wollnik | H01J 49/0422 |
| | | | | | 250/286 |
| 2015/0014525 | A1 | * | 1/2015 | Ouyang | H01J 49/0404 |
| | | | | | 250/287 |
| 2016/0118237 | A1 | * | 4/2016 | Ouyang | H01J 49/0404 |
| | | | | | 250/288 |
| 2017/0154761 | A1 | * | 6/2017 | Ouyang | H01J 49/0404 |
| 2018/0129180 | A1 | * | 5/2018 | Forbell | G05B 19/0428 |

OTHER PUBLICATIONS

International Search Report and Written Opinion dated Mar. 9, 2015 from corresponding International PCT Application No. PCT/TH2014/000053, 10 pages.

Ryabchikov A I et al: "Vacuum arc ion and plasma source Raduga 5 for materials treatment", Review of Scientific Instruments, AIP, Melville, NY, US, vol. 69, No. 2, Feb. 1, 1998 (Feb. 1, 1998), pp. 893-895, XP012036397, ISSN: 0034-6748, DOI: 10.1063/1.1148585.

* cited by examiner

| Sample | Surface Roughness (um) | | | | | | | | | | | |
|---|---|---|---|---|---|---|---|---|---|---|---|---|
| | Ra | | | | Rq | | | | Rz | | | |
| | | | | Avg. | | | | Avg. | | | | Avg. |
| AlTiN_filter | 3 | 0.1481 | 0.1433 | 0.1408 | 0.1441 | 0.1903 | 0.1852 | 0.1879 | 0.1878 | 1.2237 | 1.3159 | 1.4565 | 1.3320 |
| | 4 | 0.1429 | 0.1455 | 0.1602 | 0.1495 | 0.1877 | 0.2055 | 0.2075 | 0.2002 | 1.4882 | 1.3588 | 1.4322 | 1.4264 |
| | 5 | 0.1575 | 0.1659 | 0.1737 | 0.1657 | 0.2123 | 0.2373 | 0.2275 | 0.2257 | 1.7922 | 1.5569 | 1.4621 | 1.6037 |
| AlTiN_No_filter | 2 | 0.2198 | 0.2461 | 0.1834 | 0.2164 | 0.2895 | 0.4255 | 0.2407 | 0.3186 | 3.2194 | 1.8906 | 1.6287 | 2.2462 |
| | 7 | 0.1938 | 0.1753 | 0.1623 | 0.1771 | 0.3098 | 0.2473 | 0.2450 | 0.2674 | 1.7790 | 2.3473 | 2.0418 | 2.0560 |
| | 8 | 0.1814 | 0.1935 | 0.1884 | 0.1878 | 0.2417 | 0.2624 | 0.2584 | 0.2542 | 1.9631 | 1.8711 | 1.9490 | 1.9277 |

Fig. 13

| | Sample | Ra (um) | | Ra Diff. (um) | Avg. Diff(um) | Avg. Diff (%) |
|---|---|---|---|---|---|---|
| | | after Avg. | before Avg. | | | |
| AlTiN_filter | 3 | 0.1441 | 0.1314 | 0.0127 | 0.0248 | 63.7% |
| | 4 | 0.1495 | 0.1238 | 0.0257 | | |
| | 5 | 0.1657 | 0.1297 | 0.0360 | | |
| AlTiN_No_filter | 2 | 0.2164 | 0.1393 | 0.0771 | 0.0684 | |
| | 7 | 0.1771 | 0.1111 | 0.0660 | | |
| | 8 | 0.1878 | 0.1257 | 0.0621 | | |

Fig. 14

FILTER APPARATUS FOR ARC ION EVAPORATOR USED IN CATHODIC ARC PLASMA DEPOSITION SYSTEM

FIELD OF THE INVENTION

This present invention relates to the application of vacuum arc technology. By using the filtered plasma from arc ion evaporator for coating deposition, synthesis of nano-powder material, ion implantation for surface improvement and other usage are possible by this technology. For example, the filtered plasma obtained from this present invention can be used in, but not limited, the field of mechanical engineering, instrument and tool making, production of electronic equipment, nano-powder of ceramic materials and in other fields of industry.

BACKGROUND OF THE INVENTION AND DESCRIPTION OF THE PRIOR ART

Cathodic arc plasma deposition or arc ion plating is the most proliferate technique nowadays for coating on cutting tools, molds, dies and automotive components.

This technology, originated from the development of arc ion evaporator or cathodic arc plasma source in the Soviet Union, has been developed further gradually since it is highly effective technique for industry to deposit thin film for various requirements.

One of the most important development direction of Cathodic arc plasma deposition is to confine plasma, to control the plasma behavior and to reduce the quantity of macroparticles such as molecules or large particles that contaminate in the plasma beam and in the deposited film.

There are many filter apparatuses which had been invented to control plasma and filter the large particles out. These filters use mechanical and/or magnetic field to obtain the required result and they have different pros and cons characteristics.

One of the mechanical apparatus developed in the Soviet Union by A. I. Ryabchikov is a large Venetian-blind filter.

The Ryabchikov's Venetian-blind Filter uses the large frame and places multiple plates inside this fame. The plates are angled in Venetian-blind manner placing between the arc ion evaporator and the substrate of the workpieces. By placing the Venetian-blind filter like this there is no line-of-sight between the arc ion evaporator and workpieces.

When neutral particles or large particles crash into the plates of this Venetian-blind filter, they will implant into the plates or bounce-off to other directions. While plasma which has extremely high energy level can travel through the space between the Venetian-blind filter's plates.

In order to have better plasma transportation out of Venetian-blind filter the specific pattern of electric bias is used to generate the magnetic field around each plate of this filter. And the magnetic field around the filter's plates helps accelerate plasma out of the Venetian-blind structure.

FIG. 1 (Prior Art) shows the principle of Ryabchikov's Venetian-blind filter. The arc ion evaporator 101 generates the plasma beam which consists of Positive ion 109, electron 113 and neutral particles 111. While the positive ion and electron are plasma component, neutral particles can appear in different sizes from atomic size to large particles of several micrometres or larger.

And the Venetian-blind 114 structure used for filtration is built with large rectangular plates placing parallel to one another. If the level of filtration demand is high, these plates will be angled until there is no line-of sight between the arc ion evaporator and the workpieces. When higher plasma transportation is needed, the electric current has to be specifically biased in the direction shown with number 115.

For clearer understanding of principle of Venetian-blind filter, FIG. 2 (Prior Art) shows schematic sketch of this system installed into a vacuum chamber. The arc ion evaporator (101) generates plasma beam beaming in direction towards the Venetian-blind filter (114) structure. The set of filter's plates (or vane or lamella or grill) is angled to block line-of-sight from arc ion evaporator 101 to workpiece substrate 116. And from this FIG. 2 it should be noted that in order to transport plasma out more efficiently, it needs the complex electrical system to bias the Venetian-blind filter. Such complexity limits the usage of this system mainly to the R&D task that requires extra smooth film with very low macroparticle contamination.

FIG. 3 (Prior Art) shows the principle of plasma transportation for Venetian-blind filter. By electrical bias the Venetian-blind filter system as shown in FIG. 1 and FIG. 2, the magnetic field 110 is generated around each plate or lamella 114 of the filter. When plasma beam from arc ion evaporator which consists of plasma 109 and neutral particles 111 runs into the column of filter lamella (or plates), only the plasma will travel through the space between plates, while the neutral particles get stuck and cannot pass through.

FIG. 4 (Prior Art), from U.S. Pat. No. 8,382,963 B2 issued to Frank Weber and Samuel Harris, shows the result of their study on Venetian-blind filter system working in line-of-sight mode. They have found that since the majority of neutral particles do not have trajectory perpendicular to the arc ion evaporator's target surface 102 therefore it is possible to use the depth and space between each plate 114 of filter to reduce some of large particles without the need to angle the plate to block line-of-sight between arc ion evaporator and workpiece surface. Though the coating obtained by this method may not be free from macro particles contamination but it is good enough for coating on cutting tools and automotive components.

Nevertheless, it is the nature of plasma to move in the form of rigid rotor motion (circular movement) but the filters as mentioned above are not positioned along the same line or are inconsistent with the movement of plasma, which are resulting in the unnecessary loss of plasma.

The mathematical formula $\tan \theta \text{ crit.} = D/S$ shown in FIG. 4 (Prior Art) is used for finding the critical angle of neutral particles ejected out from arc ion evaporator's target 102 surface to filter's plates 114. If the filter's plate has depth D longer than the critical value or has spacing distance S lower than the critical value obtained from this formula, the neutral particle will be confined inside the filter system.

D is the Filter depth. S is the spacing (distance) between elements (plates). $\theta$ is the angle which neutral particle ejects (emission) from the target. $\theta$ crit., or the critical angle, is the maximum angle for at least one impact with the filter. 102 is the target material of the arc ion evaporator. 114 is the filter's plate or element. 111 is the neutral particle which crushes into the filter's plate and is confined there. 111$a$ is the neutral particle that can pass through at the critical angle.

It should be noted that the critical angle also depends on the design of Target and arc ion evaporator and by using formula in FIG. 4 (Prior Art). The designer of the system can determine how much large particle filtration is needed.

For better plasma transportation, the said U.S. Pat. No. 8,382,963 B2 still uses the electrical bias according to Ryabchikov's design for magnetic field transportation of plasma.

As the characteristic of said filter is in a form of Venetian-blind filter; thus, it may be possible that some of the plasma may be deviated from or moved outside the set path toward the object. Therefore, in order to push or drive plasma to the right path or direction, it may be necessary to utilize more electrical energy, to the filter and/or the solenoid, to drive such action. Further, Weber's design puts the solenoid around the arc source and that also generates the external magnetic field comparing to the filter body, but the solenoid field tends to diverge plasma out of the center when travelling past the solenoid area. Therefore, to increase the plasma flow and maintain magnetic field line integrity, Weber used the electric bias into the Linear Venetian-blind filter lamella to generate the supporting magnetic field to guide plasma out of the filter system.

Namely, Weber used solenoid placing around the Cathodic arc source working together with the Biased Linear Venetian-blind for their system; thus creating a complex electric bias system that may contribute to very high cost on filter manufacturing. It shows that the magnetic field line of Weber's is external and complex while the magnetic field line of this invention is internal comparing to the filter body and simple.

Both Weber and Ryabchikov used higher current (30-60 A per lamella and 1 kA) to create the magnetic field to transport the plasma while this multiple straight tube filter needs only small current (only 3-5 A is needed) and wherein said plasma further has its own internal kinetic energy to help push or drive itself from the filter system. The filter system according to this invention can, as the result, transport plasma efficiently at lower energy requirement than the existing products or prior arts.

Shown in FIG. 5 (Prior Art) is the Venetian-blind filter system produced by Fraunhofer Research Institute, Dresden, Germany. This is a large system built according to Ryabchikov's design and many arc ion evaporators can be placed on one side of this filter.

However, though the Venetian-blind filter is highly effective in filtration of large particles and has high flexibility to adapt the design according to user demand but some inherent problem renders it less popular in the industrial system. Some examples of these problems are such that the structure is large and requires large room in vacuum chamber of which the effective use of space inside the vacuum chamber is needed for cost reduction. This filter system requires a complex electrical bias to generate the magnetic field, so the cost of building and maintenance of this filter system is also high. Inside the deposition chamber the coating materials will deposit on many parts of vacuum system, so it is needed to have these deposited material removed regularly. The large and complex system means the problem of uninstallation for maintenance, and it also requires larger cleaning or decoating system to remove the deposited material from the filter system.

During the Soviet Union era, I. I. Aksenov et al. studied the angular distribution of neutral particles and large particles from Cathodic arc deposition system and found the majority of neutral particles and large particles tend to emit from arc ion evaporator at 25 to 30 degree of target's surface.

This knowledge reflects in design of many Steered arc ion evaporator from numerous research institutes in the Soviet Union. By placing arc ion evaporator's target deep inside its own port and using solenoid field to drive the plasma out while neutral and large particles crush into the port's surface, the Ion/Neutral ratio becomes higher and therefore the better coatings can be obtained.

FIG. 6 (Prior Art) shows a system which uses this design concept. The arc ion evaporator's target 102 placing deep inside a port 103, or tube in case the target has round face facing into the vacuum chamber, has solenoid 104 generating magnetic field (or solenoid field) to drive the plasma out. The said plasma which is driven out by solenoid field will stream towards the workpiece 116 surface inside the vacuum chamber and deposit coating on the said workpiece surface.

FIG. 7 (Prior Art) shows the magnetic field 110 generated by solenoid coils 104. This solenoid field can guide plasma from arc ion evaporator's target 102 to workpiece's surface 116 since plasma will move along the magnetic field line.

Filter system using solenoid port has some advantages such as space required for such system is low since it can be made quite compact and it can be installed to arc ion evaporator in one to one manner. However, this kind of system is regarded as low filtration efficiency because the port used tends to be large when compared with arc ion evaporator's target diameter, so a significant amount of the neutral particles can reflect out from the wall of solenoid port and land on workpiece surface easily.

And since the price per efficiency ratio is not high, so this filter system is not much proliferate among industry communities outside the former Soviet Union countries.

I the inventor of this present invention had considered about the pros and cons of those said systems above in order to develop a new filter system. The new system has advantage points of the filter system described in the prior art and lessens the disadvantage points.

I the inventor of this present invention use multiple tubes placing parallel to one another instead of using Venetian-blind structure, so that the said multiple tubes can be installed into the port which places in front of the arc ion evaporator. By using such arrangement the volume inside the vacuum chamber can be preserved, since this present invention can be installed in one to one manner to each arc ion evaporator. And when the better plasma transportation is needed, the solenoid system can be used to generate magnetic field for driving more plasma out. By using the solenoid field, the complexity in design and production of the electrical-bias magnetic field generator system for Venetian-blind filter can be avoided.

Moreover, the Venetian-blind system is effective only in some direction, especially when worked in a line-of-sight mode; such as when the plates (or lamella) are placed horizontally without angle, it will leave large space along horizontal line and let more large particles pass out in the left and right direction. If placed vertically without angle, it will leave large space along vertical line and let more large particles pass out in the upper and lower direction.

But since this present invention uses tube structure, therefore it will block large particles from all direction and leave less of them to pass the filter system.

When compared with the pure solenoid port filter used in the Prior Art, this present invention using multiple tubes can effectively block the large particles that reflect out of the wall of solenoid ports. Therefore, this present invention is more effective in filtration and has better efficiency per cost.

DETAILED DESCRIPTION OF THE INVENTION

FIG. 8 (Present Invention) shows the principle of multiple straight tube filter system for arc ion evaporator according to this invention. arc ion evaporator 101 has target 102 installed as a cathode to evaporate the wanted materials. Plasma and particles emitting out of target travel in the direction shown by an arrow into the parallel multiple straight tubes that filter the neutral and large particles out from plasma beam. This said parallel multiple straight tubes consist of a straight innermost tube 105, a set of adjacent straight tube 106, a set of subsequent adjacent straight tube 107 placing in parallel manner with one another and containing inside the outermost straight tube 103. Preferably, number or quantity of a set of adjacent straight tubes are from 2 tubes to multiple tubes depending on the designer's demand. The depth and space distance of these tubes can be determined according to the designer experiment or by using the mathematic formula shown in FIG. 4.

By such an arrangement the plasma beam which has higher energy level and more volatile than gas can pass through the space between the parallel multiple straight tubes. While the neutral or large particles, which tend to have trajectory angled to the parallel multiple straight tube filter system, when reaching the filter they will be implanted within the filter system or stopped there.

When the better plasma transportation is needed, the electric solenoid coils 104 will be installed surrounding the outermost straight tube 103. And since the solenoid field or magnetic field generated will have field line parallel to the parallel multiple straight tubes, then the plasma (and/or ion) will be guided out of the filter system more efficiently.

For the set of parallel multiple straight tubes such as 105, 106, 107 (which consists of innermost and adjacent straight tubes) shown in FIG. 8 the designer of the system can choose technique to bias the said tubes system like this (but not limited to), to have the said system of parallel straight tubes stay electrically float, or to have the said system of parallel straight tubes become positive when compared with the arc ion evaporator's target potential to help stabilize the Arc ion evaporator in case it is not so stable, or to have the said system of parallel straight tubes assist in generating the high electric potential field when compared with the workpiece for better control of the coating structure, or for ion implantation, or for ion etching of workpiece, etc.

The material used for tube construction can be chosen from various materials as long as it can withstand the heat and/or erosive properties of the plasma beam. So it can be (but not limited to) refractory metal, metal alloy, ceramics, composite materials, etc. in the manner that the designer of the system thinks it suitable.

FIG. 9 (Present Invention) shows the filtration process happened inside the parallel multiple straight tube system of this invention. When the plasma beam from the arc ion evaporator travels along the arrow direction to the filter system, the positive ion [+sign] 109 which is the plasma component that can be affected by magnetic field will be guided along the magnetic field line 110, or solenoid field line generated from solenoid coils 104, which is also parallel to the multiple straight tube system (that consists of the outermost straight tube 103 and inside tube system). The said positive ion will be guided past the multiple straight tube system easily, but for the neutral particles 111, which are not affected by magnetic field and tend to move in trajectory 112 angled with the multiple straight tube system, will collide with one of the tubes wall and stop right there or may get reflected and stopped inside the multiple straight tube system.

FIG. 10 (Present Invention) shows the front view of parallel multiple straight tube filter system according to this invention. Likewise shown in FIG. 8, tube 105, 106, 107 are the straight innermost tube, adjacent straight tube and subsequent adjacent straight tube, while 103 is the outermost straight tube having a set of solenoid coils 104 surrounding outside. Electrical-bias system 108 is used for biasing the said solenoid.

Parallel multiple straight tube filter system that has circular front view structure like this FIG. 10 scheme is suitable for installation to arc ion evaporator with target having circular front area.

FIG. 11 (Present Invention) shows the front view of parallel multiple straight tube filter system according to this invention. Likewise shown in FIG. 8, tube 105, 106, 107 are the innermost straight tube, adjacent straight tube and subsequent adjacent straight tube, while 103 is the outer most straight tube having solenoid coils 104 surrounding outside. Electrical bias system 108 is used for biasing the said solenoid.

Parallel multiple straight tube filter system that has rectangular front view structure like this FIG. 11 scheme is suitable for installation to arc ion evaporator with target having rectangular front area.

FIG. 12 (Present Invention) is a schematic showing example of an experimental parallel multiple straight tubes that are installed inside the solenoid tube.

FIG. 13 illustrates the result of Roughness test: Roughness average (Ra), Roughness root mean square (Rq) and Roughness Ten-point mean (Rz) of the unfiltered and filtered TiAlSiN coated samples according to this invention wherein the roughness value of the filtered coated sample is lower than the unfiltered coated sample.

FIG. 14 illustrates a comparative roughness value before and after TiAlSiN coating of the filtered and unfiltered samples wherein the unfiltered samples have an increase in average roughness value of 0.0684 um; on the other hand, the filtered samples according to this invention have an increase in average roughness value of only 0.0248 um. The result has clearly indicated that the samples that have undergone through the filter system according to this invention are 63.7% smoother than the unfiltered samples.

Further, FIG. 15 and FIG. 16 show photographs of the samples before and after TiAlSiN coating through the filter and non-filter systems from an electron microscope under 2,500 magnifications wherein the filtered samples have the deposition rate of 1.5 um/hr. The pressure condition used in the filtered plasma coating was set at least 0.1 Pa., wherein a pressure according to this invention is from 0.1-1.5 Pa, preferably at 0.5-1.5 Pa, in N2 gas. The filter straight tube length used was 40 mm. and with spacing 20 mm. There were both types of multiple straight tube filters, the non solenoid-coiled and the solenoid-coiled depending on the type of arc sources used in the experiment which was done in the machine equipped with multiple arc sources. Each of the solenoid-coiled ones was electrically biased at 24 V. 3-5 A.

BRIEF DESCRIPTION OF THE DRAWINGS

FIG. 13 illustrates the result of Roughness test: Roughness average (Ra), Roughness root mean square (Rq) and Roughness Ten-point mean (Rz) of the unfiltered and filtered TiAlSiN coated samples, wherein done at cut-off length 0.8 and measuring length 5 mm.

FIG. 14 illustrates a comparative roughness value before and after TiAlSiN coating of the filtered and unfiltered samples

DESCRIPTION OF THE PREFERRED EMBODIMENTS

Figure 1:
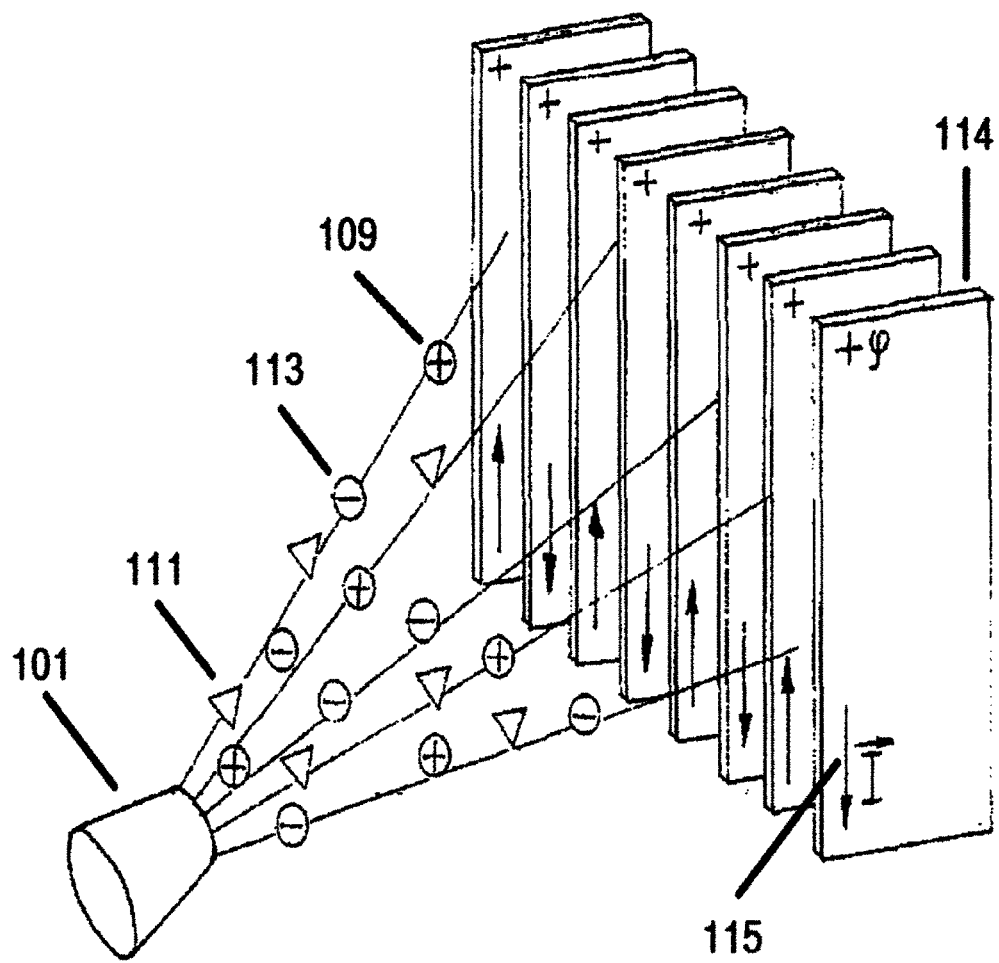
FIG. 1 (Prior Art) is a schematic view of Venetian-blind Filter from Ref. 1
Figure 2:
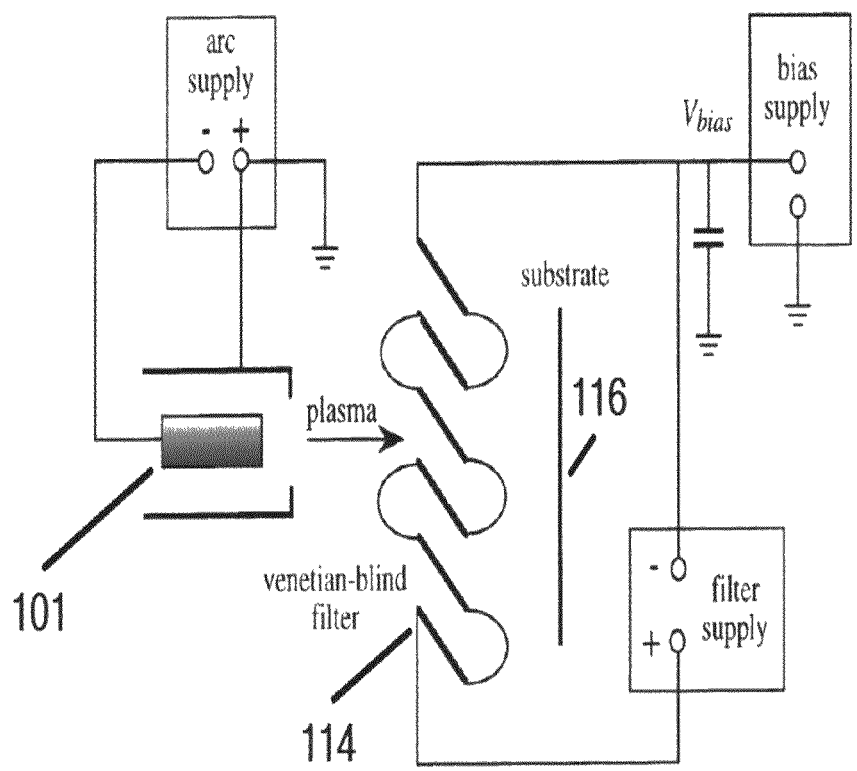
FIG. 2 (Prior Art) is a schematic view of Venetian-blind Filter from Ref. 2
Figure 3:
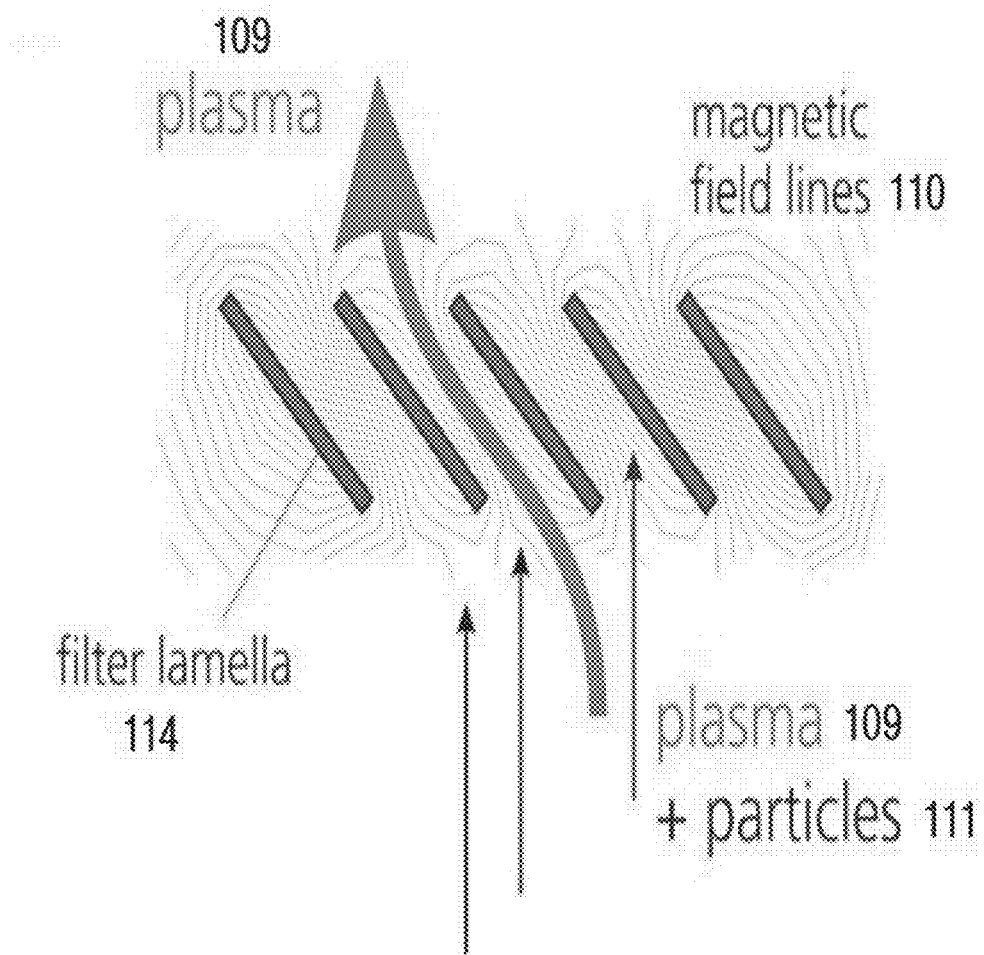
FIG. 3 (Prior Art) shows plasma transportation along magnetic field line from Ref 3
Figure 4:
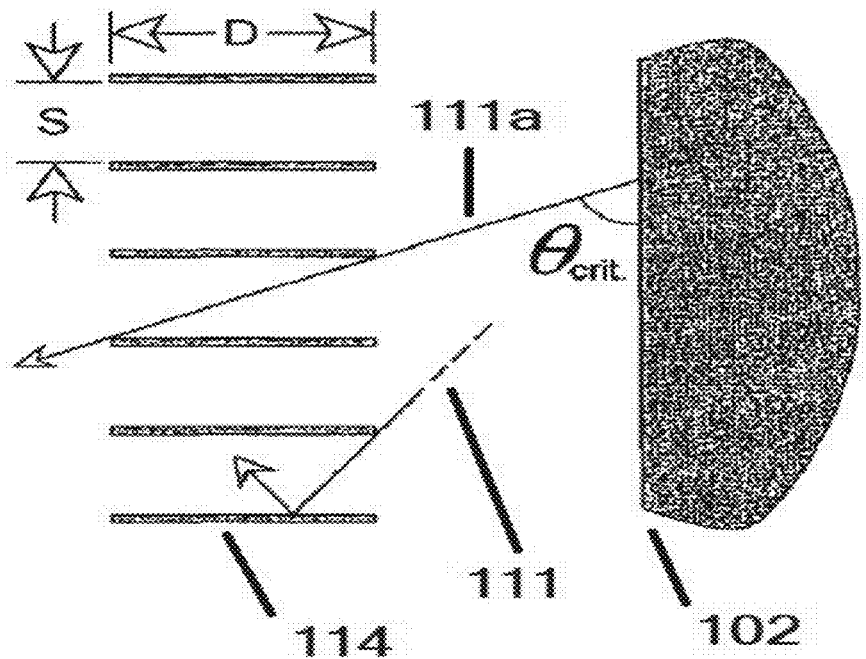
FIG. 4 (Prior Art) shows mathematic formula used to determine the critical angle for the line of sight mode Venetian-blind filter from Ref 6
Figure 5:
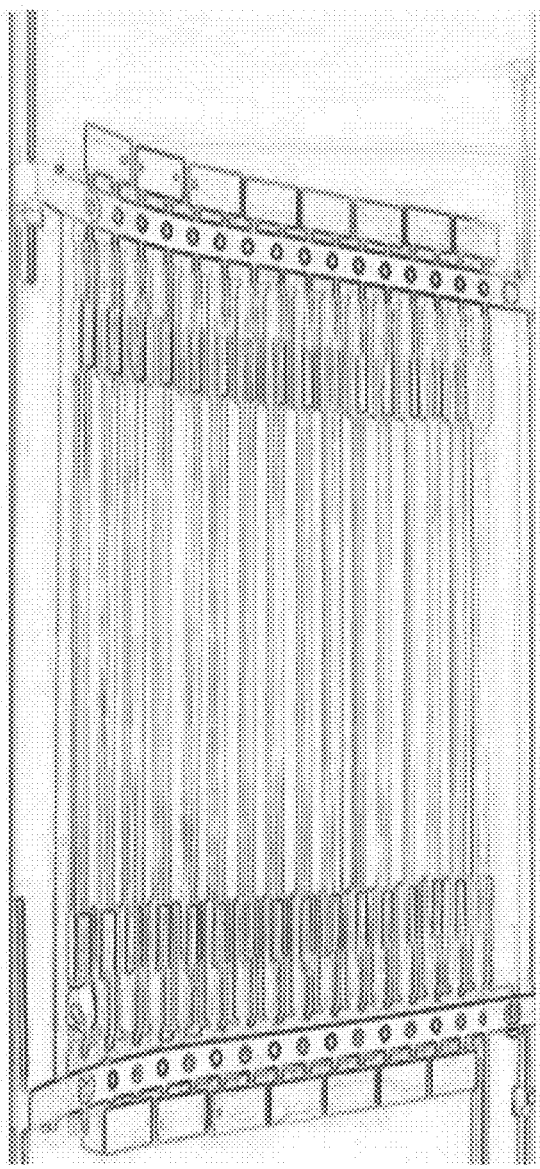
FIG. 5 (Prior Art) is a schematic view of Ryabchikov type Venetian-blind filter from Ref 3
Figure 6:
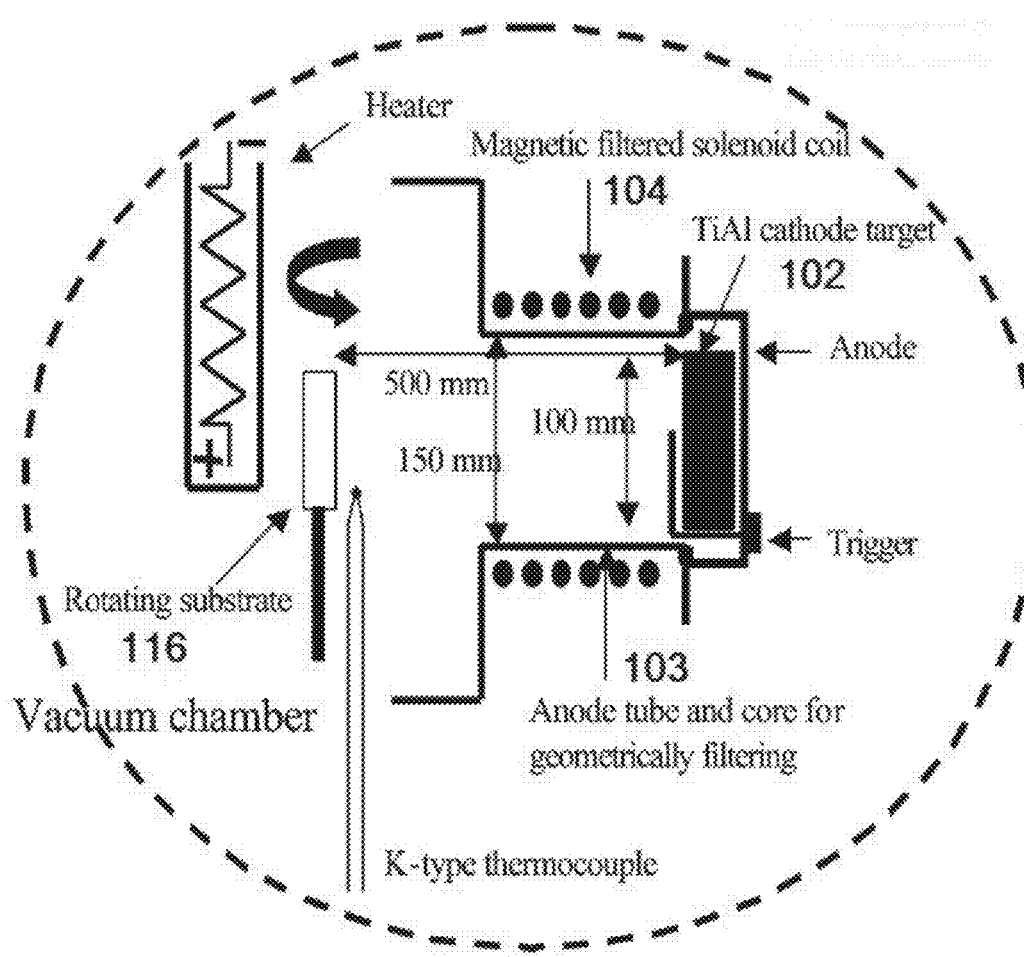
FIG. 6 (Prior Art) is a schematic view of filter apparatus using solenoid field from Ref 5
Figure 7:
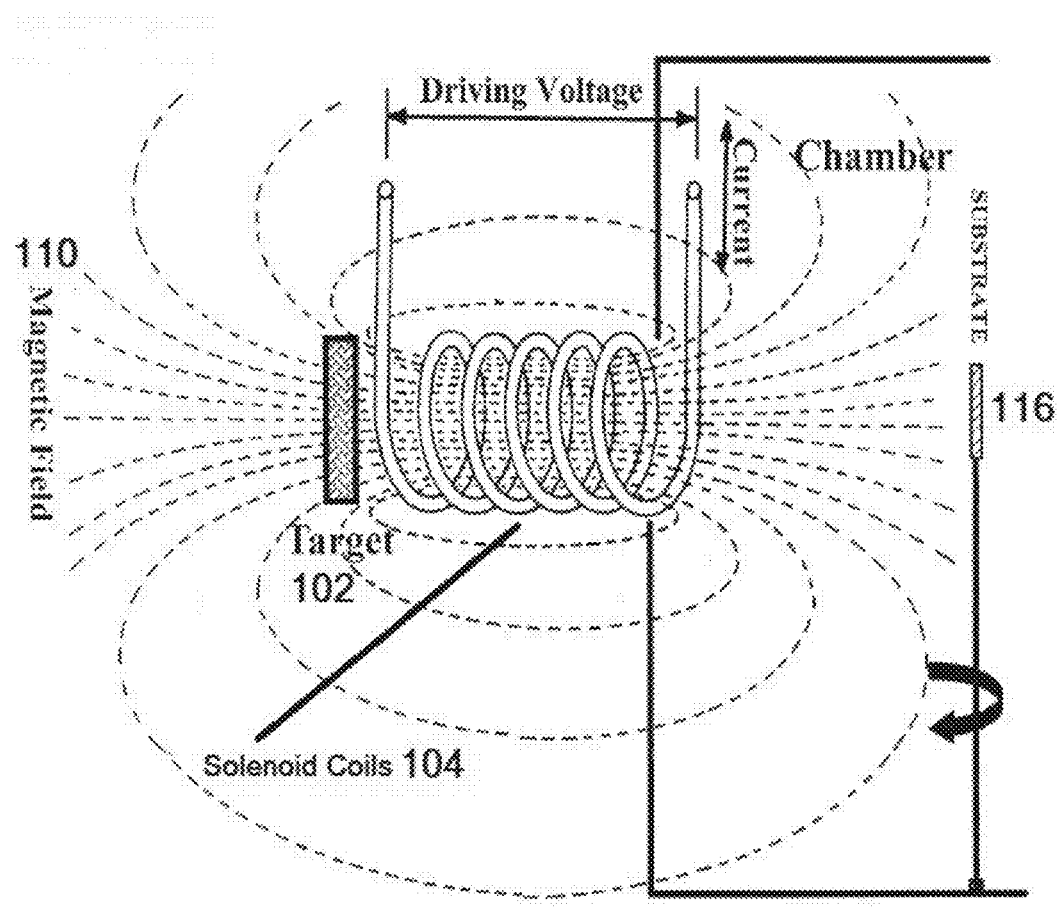
FIG. 7 (Prior Art) is a schematic view of magnetic field generated by solenoid from Ref. 5
Figure 8:
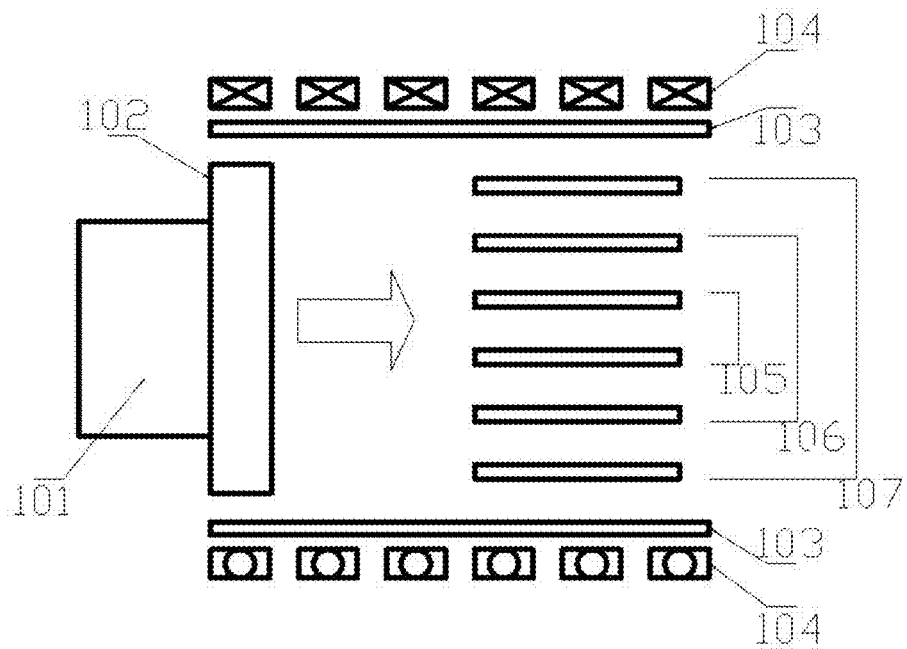
FIG. 8 (Present Invention) is a schematic side view of parallel multiple straight tube Filter FIG. 9 (Present Invention) shows the principle of parallel multiple straight tube filter FIG. 10 (Present Invention) is a schematic front view of parallel multiple straight tube Filter for circular face arc ion evaporator FIG. 11 (Present Invention) is a schematic front view of parallel multiple straight tube filter for rectangular face arc ion evaporator FIG. 12 (Present Invention) is a schematic view of an experimental parallel multiple straight tube placing inside the solenoid tube
Figure 9:
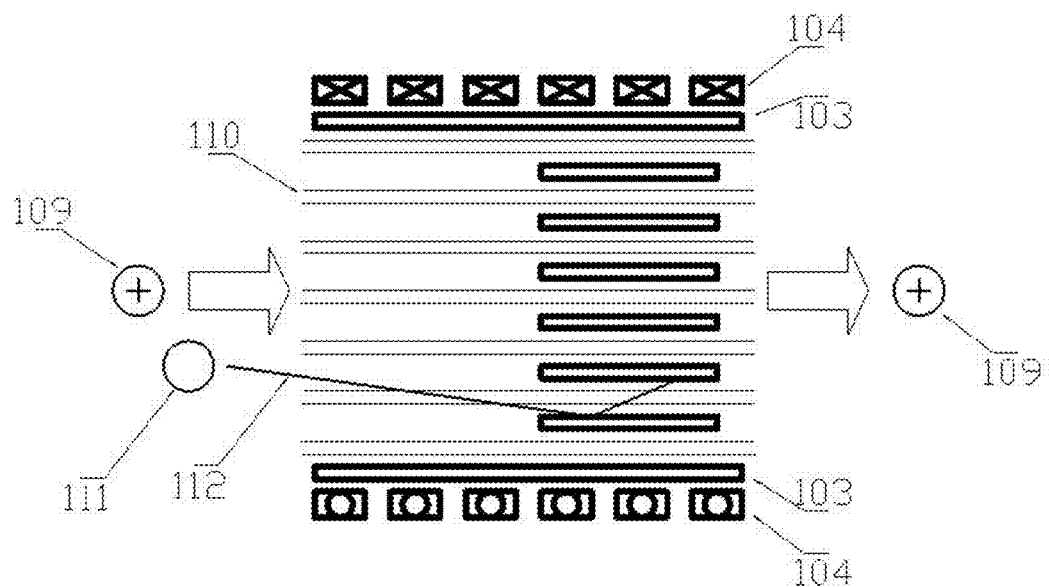
Figure 10:
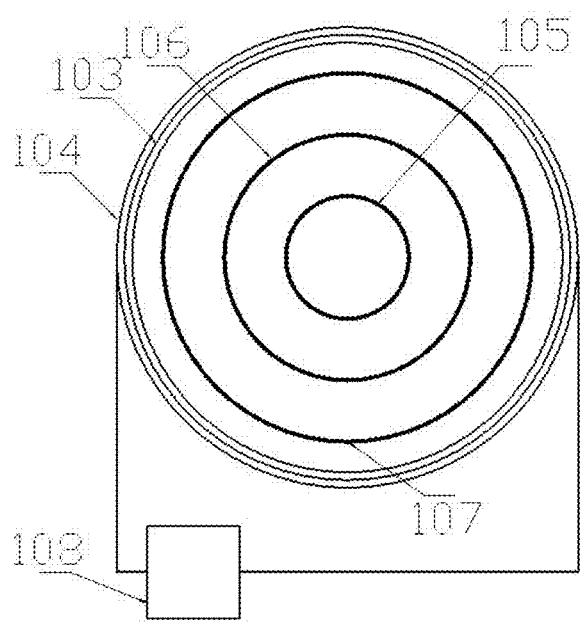
Figure 11:
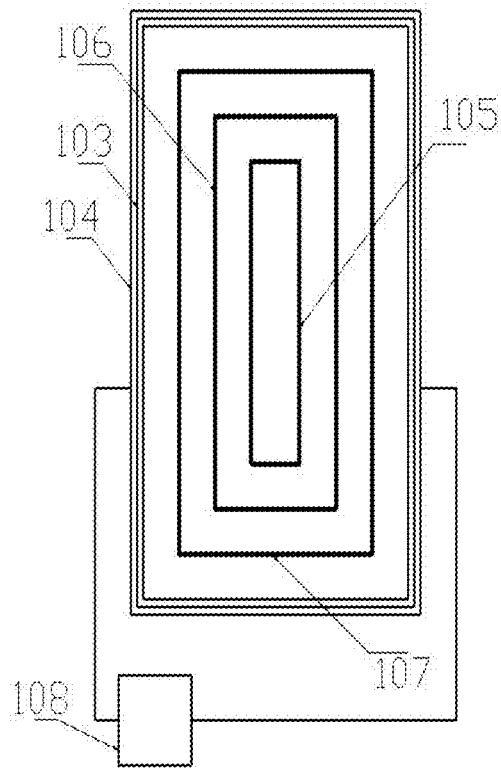
Figure 12:
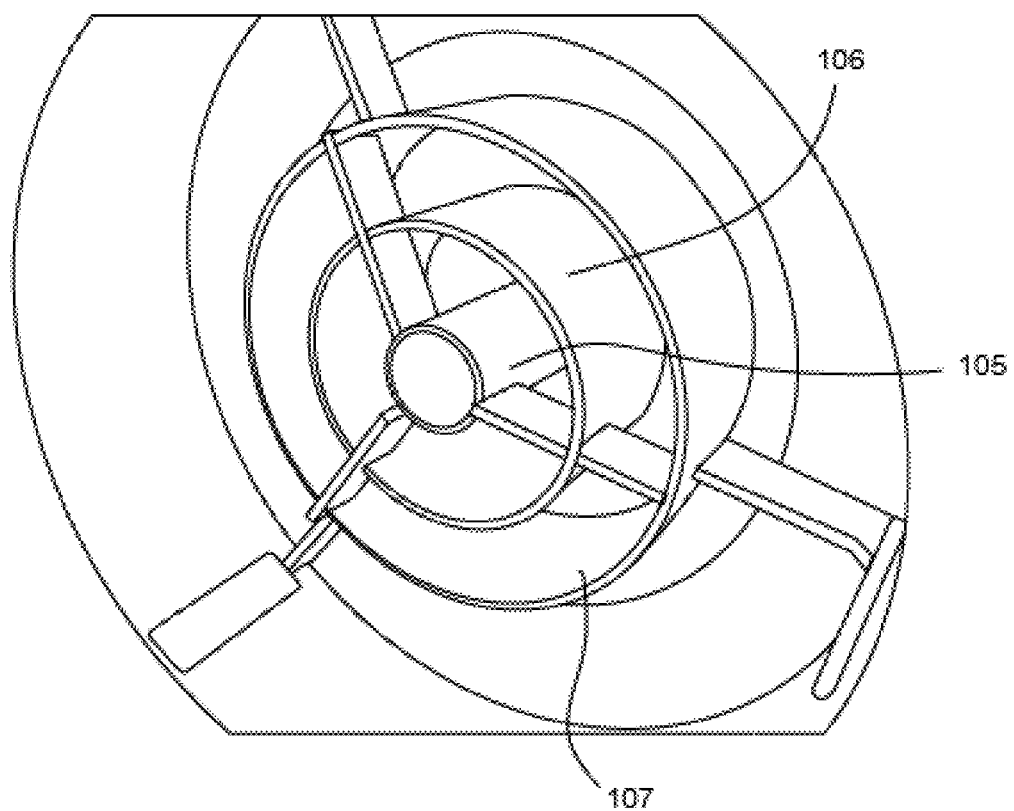
Figure 15:
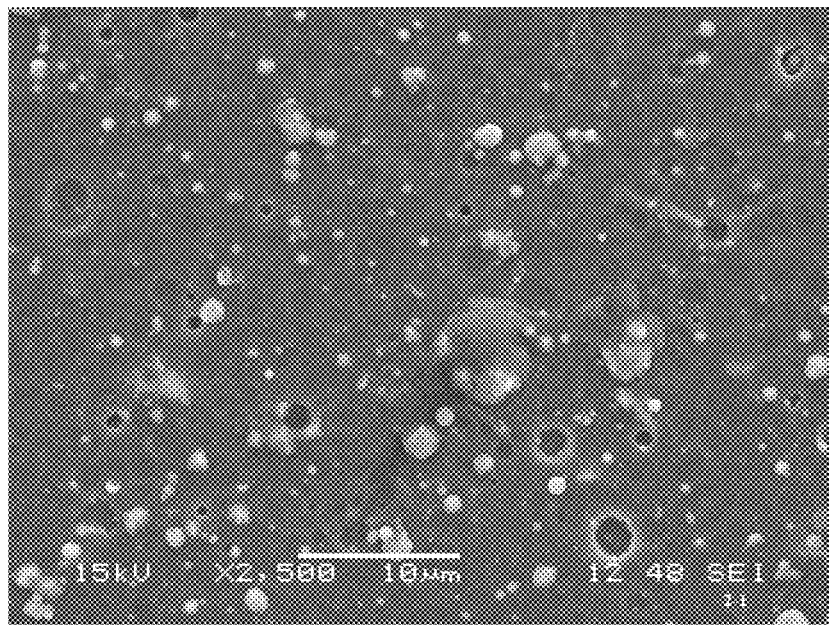
FIG. 15 illustrates the Scanning Electron Microscopy derived photographs of unfiltered TiAlSiN coating at 2,500×X
Figure 16:
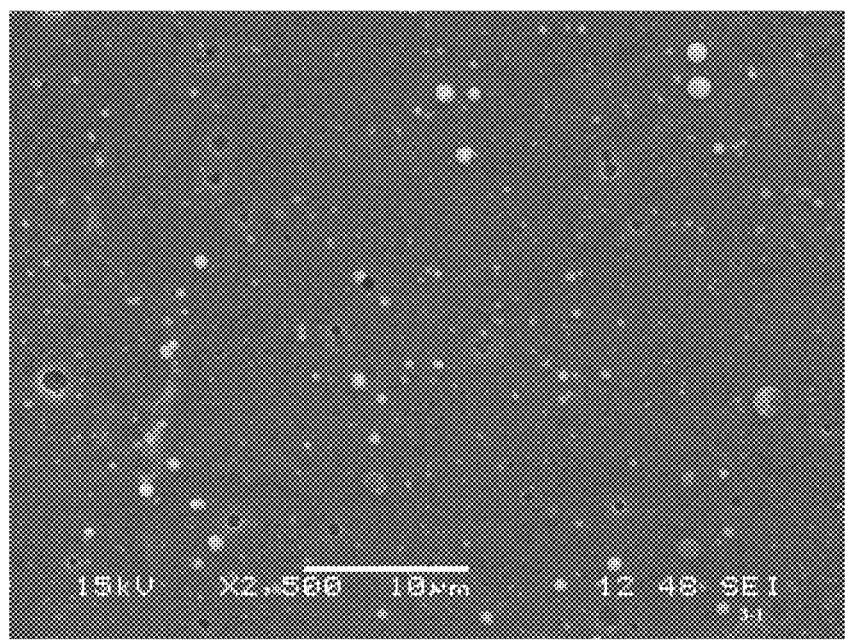
FIG. 16 illustrates the Scanning Electron Microscopy derived photographs of filtered TiAlSiN coating at 2,500×X

Parallel multiple straight tube filter system according to FIG. 8 of this present invention consists of arc ion evaporator 101 which has target 102 installed as its cathode to evaporate the wanted material in plasma form. The said plasma and neutral particles which are generated from the said arc ion evaporator will travel in the arrow direction into the parallel multiple straight tube system that will filter the neutral and large particles out of plasma beam. This said parallel multiple straight tubes consist of innermost straight tube 105, a set of adjacent straight tube 106, a set of subsequent adjacent straight tube 107 placing in parallel manner with one another and contained inside the outermost straight tube 103. Preferably, number or quantity of a set of adjacent straight tubes are from 2 tubes to multiple tubes depending on the designer demand. And for better plasma transportation, the electric solenoid coils 104 are installed surrounding the outermost tube, so the magnetic field (or solenoid field) generated will guide plasma out of the filter system more efficiently.

The invention claimed is:

1. A filter apparatus for an arc ion evaporator used in a cathodic arc plasma deposition system comprising:
a parallel set of multiple straight tubes operable to filter neutral particles including large particles out of a plasma beam from an arc ion evaporator or a cathodic arc source wherein the multiple straight tubes comprising:
a straight innermost tube transparent to a plasma stream in a line of sight perpendicular to a cathode plane;
a set of adjacent straight tubes;
a set of subsequent adjacent straight tube placed in a parallel manner to one another and placed inside an outermost straight tube in a concentric ring manner; and
a set of solenoid coils chosen from metal or electric conducting wires placed around the outermost straight tube in a helical manner in order for a solenoid field or a magnetic field to be generated to guide or move plasma out of the filter apparatus.

2. The filter apparatus for arc ion evaporator used in the cathodic arc plasma deposition system according to claim 1 wherein the filter apparatus is equipped with an arc ion evaporator or a cathodic arc source.

3. The filter apparatus for arc ion evaporator used in the cathodic arc plasma deposition system according to any of claim 1 or 2 wherein the filter apparatus is a built-in apparatus as a single unit or is welded to or fastened with the arc ion evaporator or the cathodic arc source.

4. A filter apparatus for an arc ion evaporator used in a cathodic arc plasma deposition system comprising:
a parallel set of multiple straight tubes operable to filter neutral particles including large particles out of a plasma beam from the arc ion evaporator or a cathodic arc source wherein the multiple straight tubes comprising:
a straight innermost tube transparent to a plasma stream in a line of sight perpendicular to a cathode plane;
a set of adjacent straight tubes; and
a set of subsequent adjacent straight tube placed in a parallel manner to one another and placed inside the outermost straight tube in a concentric ring manner.

5. The filter apparatus for arc ion evaporator used in the cathodic arc plasma deposition system according to claim 4 wherein the filter apparatus is equipped with the arc ion evaporator or the cathodic arc source.

6. The filter apparatus for arc ion evaporator used in the cathodic arc plasma deposition system according to any of claim 4 or 5 wherein the filter apparatus is a built-in apparatus as a single unit or is welded to or fastened with the arc ion evaporator or the cathodic arc source.

7. The filter apparatus for arc ion evaporator used in the cathodic arc plasma deposition system according to any of claims 1, 2, 4 or 5 wherein the arc ion evaporator or the cathodic arc source further comprising a consumable cathode that can be selected from cylindrical, rectangular plate or blunted cone.

8. The filter apparatus for arc ion evaporator used in the cathodic arc plasma deposition system according to claim 4 wherein the filter apparatus uses kinetic energy of the plasma stream to force the plasma out of the filter system.

9. The filter apparatus for arc ion evaporator used in the cathodic arc plasma deposition system according to any of claim 1 or 4 wherein filter apparatus further comprising a set of permanent magnets or an electromagnetic circuit for transporting plasma out of said filter system.

10. The filter apparatus for arc ion evaporator used in the cathodic arc plasma deposition system according to claim 8 wherein the filter apparatus is equipped with the arc ion evaporator or the cathodic arc source.

11. The filter apparatus for arc ion evaporator used in the cathodic arc plasma deposition system according to claim 9 wherein the filter apparatus is a built-in apparatus as a single unit or is welded to or fastened with the arc ion evaporator or the cathodic arc source.

12. The filter apparatus for arc ion evaporator used in the cathodic arc plasma deposition system according to claim 10 wherein the arc ion evaporator or the cathodic arc source further comprising a consumable cathode that can be selected from cylindrical, rectangular plate or blunted cone.

13. The filter apparatus for arc ion evaporator used in the cathodic arc plasma deposition system according to claim 6 wherein the arc ion evaporator or the cathodic arc source further comprising a consumable cathode that can be selected from cylindrical, rectangular plate or blunted cone.

14. The filter apparatus for arc ion evaporator used in the cathodic arc plasma deposition system according to claim 3 wherein the arc ion evaporator or the cathodic arc source further comprising a consumable cathode that can be selected from cylindrical, rectangular plate or blunted cone.

15. The filter apparatus for arc ion evaporator used in the cathodic arc plasma deposition system according to claim 9 wherein the filter apparatus is equipped with the arc ion evaporator or the cathodic arc source.

16. The filter apparatus for arc ion evaporator used in the cathodic arc plasma deposition system according to claim 10 wherein the filter apparatus is a built-in apparatus as a single unit or is welded to or fastened with the arc ion evaporator or the cathodic arc source.

17. The filter apparatus for arc ion evaporator used in the cathodic arc plasma deposition system according to claim 11 wherein the arc ion evaporator or the cathodic arc source further comprising a consumable cathode that can be selected from cylindrical, rectangular plate or blunted cone.

18. The filter apparatus for arc ion evaporator used in the cathodic arc plasma deposition system according to any of claims 1, 2, 4, 5, 8, 10, 11, 12, 14, 15, 16 or 17 wherein the arc ion evaporator or the cathodic arc source that equipped with filter apparatus further comprising the purpose of surface coating, thin film deposition, synthesis of materials that have specific structure in micro meter range, synthesis of materials that have specific structure in nano meter range, synthesis of various nano-materials such as nano-ceramic powder or synthesis of Diamond-Like Carbon.

19. The filter apparatus for arc ion evaporator used in the cathodic arc plasma deposition system according to claim 6 wherein the arc ion evaporator or the cathodic arc source that equipped with filter apparatus further comprising the purpose of surface coating, thin film deposition, synthesis of materials that have specific structure in micro meter range, synthesis of materials that have specific structure in nano meter range, synthesis of various nano-materials such as nano-ceramic powder or synthesis of Diamond-Like Carbon.

20. The filter apparatus for arc ion evaporator used in the cathodic arc plasma deposition system according to claim 9 wherein the arc ion evaporator or the cathodic arc source that equipped with filter apparatus further comprising the purpose of surface coating, thin film deposition, synthesis of materials that have specific structure in micro meter range, synthesis of materials that have specific structure in nano meter range, synthesis of various nano-materials such as nano-ceramic powder or synthesis of Diamond-Like Carbon.

* * * * *